(12) United States Patent
Tseng et al.

(10) Patent No.: US 8,680,635 B2
(45) Date of Patent: Mar. 25, 2014

(54) CMOS IMAGE SENSOR BIG VIA BONDING PAD APPLICATION FOR AICU PROCESS

(71) Applicant: Taiwan Semiconductor Manufacturing Company, Ltd., Hsin-Chu (TW)

(72) Inventors: Uway Tseng, Dong-shi Town (TW); Lin-June Wu, Hsin-Chu (TW); Yu-Ting Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/728,710

(22) Filed: Dec. 27, 2012

(65) Prior Publication Data

US 2013/0134543 A1       May 30, 2013

Related U.S. Application Data

(62) Division of application No. 12/511,789, filed on Jul. 29, 2009, now Pat. No. 8,344,471.

(51) Int. Cl.
*H01L 31/0232* (2006.01)

(52) U.S. Cl.
USPC ............ 257/432; 438/69; 257/E31.127

(58) Field of Classification Search
USPC ............... 257/432, E31.127; 438/69
See application file for complete search history.

(56) References Cited

U.S. PATENT DOCUMENTS

| | | | |
|---|---|---|---|
| 7,101,726 | B2 | 9/2006 | Yamamoto et al. |
| 7,859,033 | B2 | 12/2010 | Brady |
| 2009/0032893 | A1 | 2/2009 | Weng et al. |
| 2009/0039452 | A1* | 2/2009 | Hsieh et al. .......... 257/432 |
| 2009/0065824 | A1* | 3/2009 | Hwang ............... 257/292 |
| 2009/0206434 | A1* | 8/2009 | Hashimoto .......... 257/432 |
| 2009/0242948 | A1* | 10/2009 | Barrett et al. ........ 257/291 |
| 2009/0286346 | A1* | 11/2009 | Adkisson et al. ...... 438/65 |
| 2010/0301483 | A1* | 12/2010 | Gaebler ............... 257/758 |

FOREIGN PATENT DOCUMENTS

| | | |
|---|---|---|
| DE | 102007051752 A1 * | 5/2009 |
| JP | 11340319 | 12/1999 |
| JP | 2005/191492 | 7/2005 |
| JP | 2006/253422 | 9/2006 |
| TW | 2006/42036 | 4/1995 |
| TW | 452930 | 9/2001 |
| TW | 2008/27248 | 7/2008 |

OTHER PUBLICATIONS

Taiwanese Patent Office, Office Action dated Dec. 17, 2012, Application No. 10121422630, 10 pages.
Japanese Patent Office, Office Action dated Dec. 25, 2012, Application No. 2010-170162, 3 pages.

* cited by examiner

*Primary Examiner* — Steven J Fulk
(74) *Attorney, Agent, or Firm* — Haynes and Boone, LLP

(57) ABSTRACT

An integrated circuit includes a substrate having a bonding pad region and a non-bonding pad region. A relatively large via, called a "big via," is formed on the substrate in the bonding region. The big via has a first dimension in a top view toward the substrate. The integrated circuit also includes a plurality of vias formed on the substrate in the non-bonding region. The plurality of vias each have a second dimension in the top view, the second dimension being substantially less than the first dimension.

20 Claims, 9 Drawing Sheets

CMOS IMAGE SENSOR BIG VIA BONDING PAD APPLICATION FOR AICU PROCESS

PRIORITY DATA

The present application is a divisional application of U.S. patent application Ser. No. 12/511,789, filed Jul. 29, 2009, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Pads used for various applications, such as probe and/or wire bonding (generally referred to hereafter as a bonding pad) often have separate requirements than other features of an IC. For example, a bonding pad must have sufficient size and strength to withstand physical contact due to such actions as probing or wire bonding. There is often a simultaneous desire to make features relatively small (both in size and in thickness). For example, in applications such as a complementary metal-oxide semiconductor (CMOS) image sensor, it is often desired to have one or more relatively thin metal layers, for example a metal layer of aluminum copper (AlCu). A problem with thin metal layers is that the bond pads formed in these layers can exhibit peeling or other defects. A need therefore exists to accommodate the various requirements of these features.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
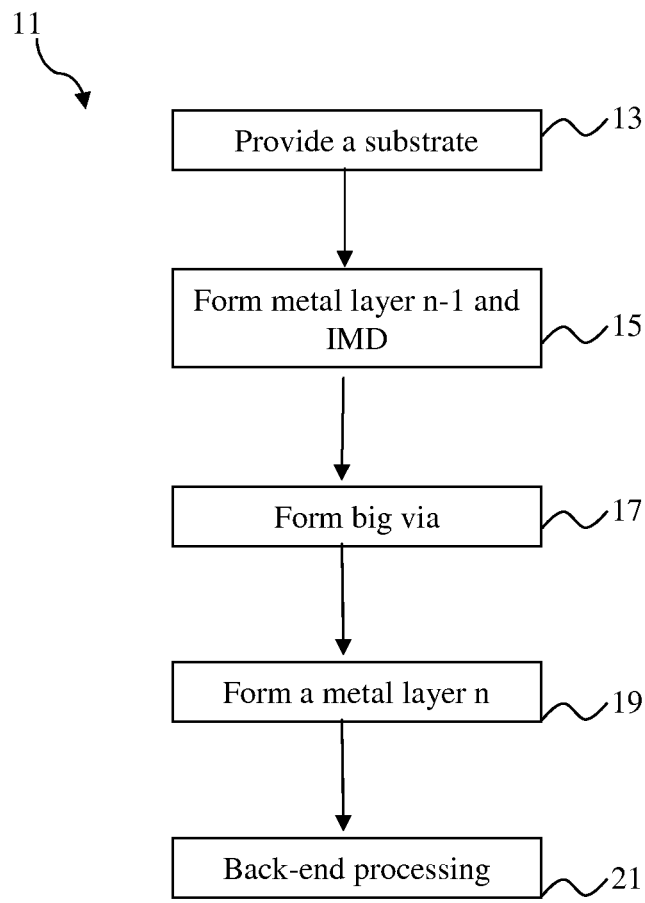
FIG. 1 is a flowchart illustrating a method of forming a via in a semiconductor device according to various aspects of the present disclosure.

The present disclosure provides many different embodiments of the present invention. In one embodiment, the present disclosure describes an integrated circuit, including a substrate having a bonding pad region and a non-bonding pad region. A relatively large via, called a "big via," is formed on the substrate in the bonding region. The big via has a first dimension in a top view toward the substrate. In one embodiment, the first dimension is between about 30 micrometer and about 200 micrometer. The integrated circuit also includes a plurality of vias formed on the substrate in the non-bonding region. The plurality of vias each have a second dimension in the top view, the second dimension being substantially less than the first dimension. In one embodiment, the second dimension is between about 0.1 micrometer and about 0.5 micrometer.

In another embodiment, the present disclosure describes a backside illuminated image (BSI) sensor including a substrate having a bonding region and a non-bonding region and having a front side and a backside. A first conductive line is on the front side of the substrate in the bonding region and a second conductive line is on the front side of the substrate in the non-bonding region. The BSI sensor includes a first via having a first diameter over the first conductive line and a second via having a second diameter over the second conductive line. The first diameter is substantially greater than the second diameter. The substrate can thereby be bonded to the front side of the substrate.

In another embodiment, the present disclosure describes a front side illuminated image (FSI) sensor including a substrate having a bonding region and a non-bonding region and having a front side and a backside. A first conductive line is on the front side of the substrate in the bonding region and a second conductive line is on the front side of the substrate in the non-bonding region. The FSI sensor includes a first via having a first diameter over the first conductive line and a second via having a second diameter over the second conductive line. The first diameter is substantially greater than the second diameter. The FSI sensor includes a third conductive line formed over the first via and adapted for receiving a bonding wire.

In another embodiment, a method of fabricating a semiconductor device is disclosed. The method includes providing a substrate and forming first and second conductive lines over the substrate. The first and second conductive lines are formed in a bonding pad region and a non-bonding pad region of the semiconductor device, respectively. A first via having a first width is formed over the first conductive line and a second via having a second width is formed over the second conductive line. The first width is substantially greater than the second width. The method further includes forming a third conductive line over the first via.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present invention are semiconductor devices with image sensors. Further examples of such devices are a back-side illuminated (BSI) image sensor device and a front-side illuminated (FSI) image sensor device. The following disclosure will continue with these examples to illustrate various embodiments of the present invention. It is understood, however, that the invention should not be limited to a particular type of device, except as specifically claimed.

Referring to FIG. 1, a method 11 for forming a bonding pad in a semiconductor device, such as a BSI image sensor device or a FSI image sensor device, is described. Further description of the method 11 will be made with respect to a BSI image sensor device, as discussed immediately below. Description of the method is also made with respect to a FSI image sensor device, further below. The method 11 begins with step 13 in which a substrate is provided.

Figure 2:
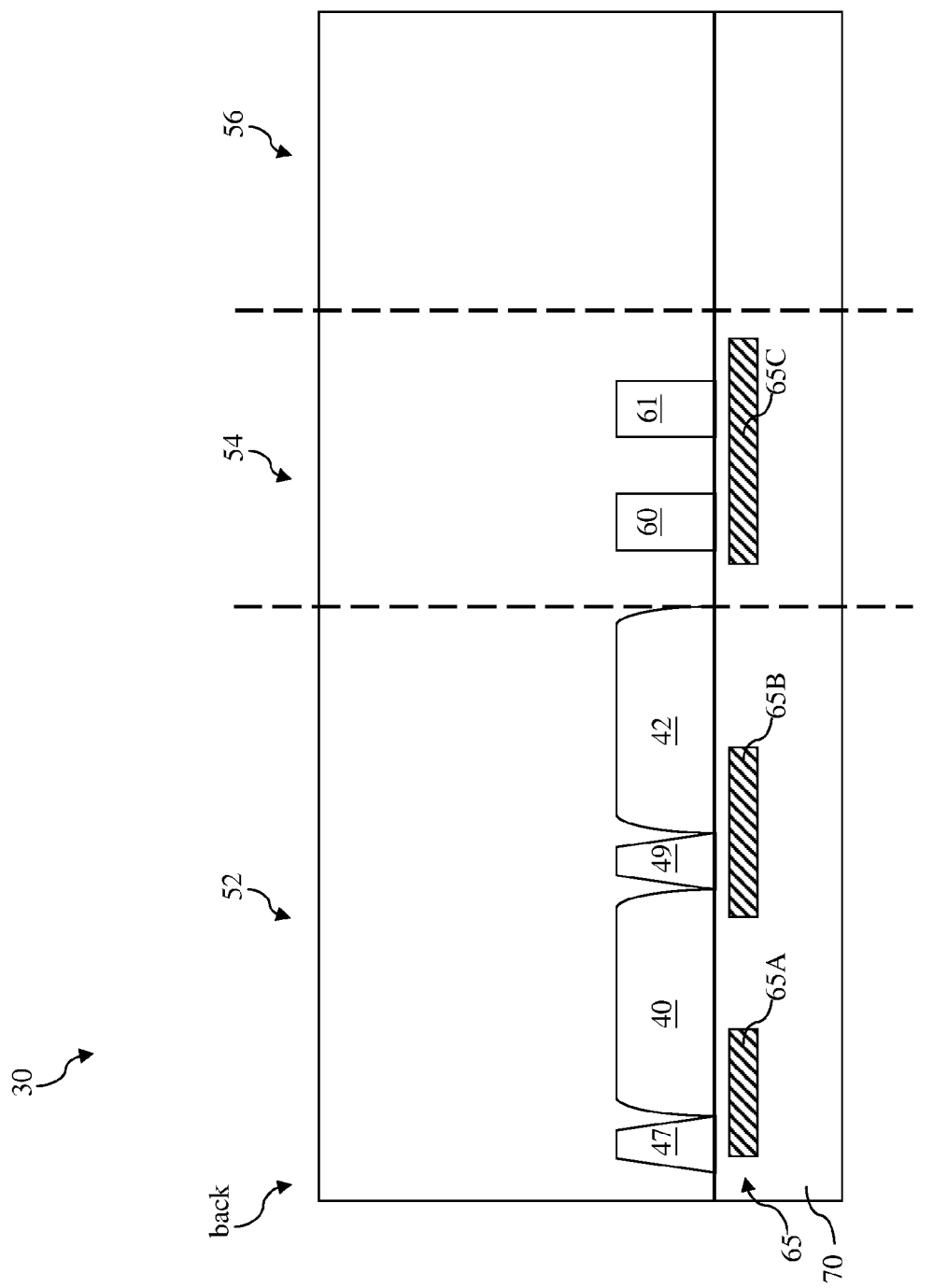
FIGS. 2 to 5 illustrate diagrammatic cross-sectional side views of one embodiment of a semiconductor device at various stages of fabrication according to the method of FIG. 1.

FIG. 2 shows a substrate for an BSI image sensor device 30. The BSI image sensor device 30 includes an array or grid of pixels 40, 42 for sensing an intensity of radiation (such as light) directed toward a back-side of the BSI image sensor device 30 (the drawing of FIG. 2 has the device arranged so that the back-side is at the top of the figure). In the present embodiment, the pixels 40, 42 include complimentary metal oxide semiconductor (CMOS) image sensors (CIS). The BSI image sensor device 30 may alternatively or additionally include other image sensors, such as a charge-coupled device (CCD), an active-pixel sensor (APS), or a passive-pixel sensor. The BSI image sensor device 30 further includes additional circuitry and input/outputs that are provided adjacent to the grid of pixels for providing an operation environment for the pixels and for supporting external communication with the pixels. Isolation structures 47, 49 are also provided in the present embodiment. It is understood that the figures have been simplified for a better understanding of the inventive concepts of the present disclosure and may not be drawn to scale.

The pixels 40 and 42 and isolation structures 47 and 49 are formed in a region of the BSI image sensor device 30 referred to as a pixel region 52. The image sensor 30 also includes a periphery region 54 and a bonding pad region 56. The dashed lines in FIG. 2 designate the boundaries between the regions 52, 54, and 56. The pixel region 52 and the periphery region 54 may also be referred to as non-bonding pad regions. The periphery region 54 includes micro-electronic devices 60 and 61. For example, the devices 60 and 61 in the present embodiment may be digital devices, such as application-specific integrated circuit (ASIC) devices or system-on-chip (SOC) devices. As another example, the devices 60 and 61 may be reference pixels that are used to establish a baseline of an intensity of light for the BSI image sensor device 30. The bonding pad region 56 is a region where one or more bonding pads of the BSI image sensor device 30 will be formed in a later processing stage, so that electrical connections between the BSI image sensor device 30 and external devices may be established.

Referring back to FIG. 1, the substrate provided at step 13 may include many different conductive layers and vias between these layers. For the sake of reference, consider that the device will eventually have "n" conductive layers, with layer "n" being the top metal layer (which will be at the bottom of the drawing in FIGS. 2-5). The substrate provided at step 13 will include metal layers 1 through n−2. The method 11 continues at step 15, where a metal layer n−1 and an inter-metal dielectric (IMD) are provided.

Referring again to the embodiment of FIG. 2, for the sake of simplicity and clarity, the metal layers 1 through n−2 are not shown. A conductive layer 65 is formed on the front side of the BSI image sensor device 30. With reference to the method 11 of FIG. 1, the conductive layer 65 represents layer "n−1." In the present embodiment, the conductive layer 65 includes a layer of aluminum material that is sandwiched between two layers of titanium nitride material. The conductive layer 65 is formed by a high density plasma chemical vapor deposition (HDPCVD) process known in the art. In various embodiments, the conductive layer 65 may include conductive materials such as aluminum, aluminum/silicon/copper alloy, titanium, titanium nitride, tungsten, polysilicon, metal silicide, or combinations thereof. In another alternative embodiment, the conductive layer 65 may include copper, copper alloy, titanium, titanium nitride, tantalum, tantalum nitride, tungsten, polysilicon, metal silicide, or combinations thereof. The conductive layer 65 in various embodiments may be formed by processes such as physical vapor deposition (PVD), chemical vapor deposition (CVD), atomic layer deposition (ALD), sputtering, plating, or combinations thereof.

The conductive layer 65 is patterned to form various conductive lines. For example, conductive lines 65A and 65B are formed in the pixel region 52 and a conductive line 65C is formed in the periphery region 54. Surrounding and above the conductive lines 65A-65C is an inter-metal dielectric (IMD) layer 70. The dielectric layer 70 includes one or more layers of an insulating material such as silicon oxide, silicon nitride, silicon oxynitride, or combinations thereof. The dielectric layer 70 is formed by a process that may include CVD, PVD, ALD, or combinations thereof.

Referring back to FIG. 1, method 11 continues at step 17, where conductive vias are formed in the IMD to connect the n−1 metal layer formed at step 15 with a next metal layer.

Figure 3:
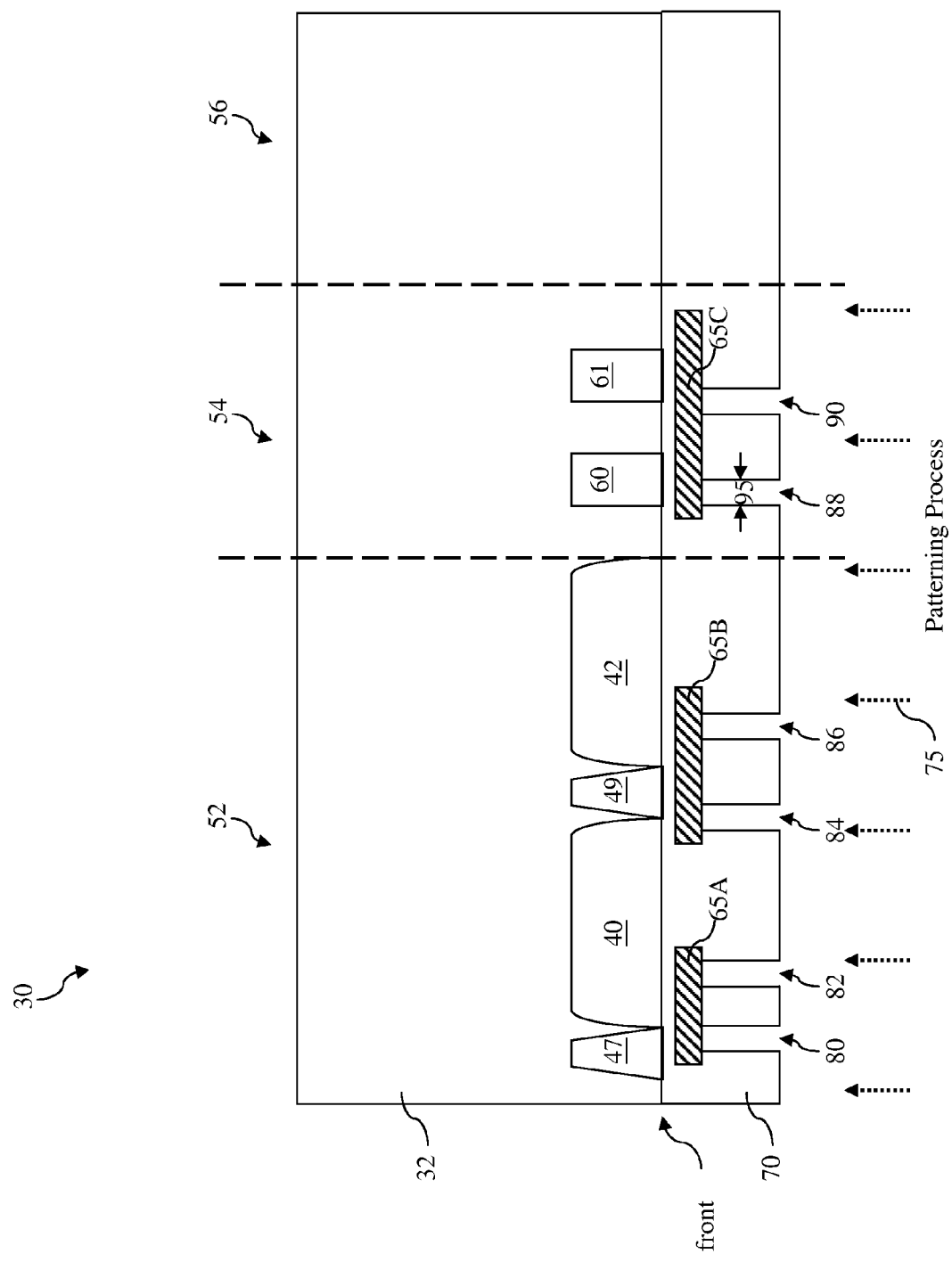

Referring now to FIG. 3 and continuing with the BSI image sensor embodiment, the dielectric layer 70 is patterned using a patterning process 75 to form a plurality of openings. For example, openings 80, 82, 84, and 86 are formed in the pixel region 52, and openings 88 and 90 are formed in the periphery region 54. The patterning process 75 includes a photolithography process and a reactive ion etching (RIE) process to define and form the openings 80-90. In the present embodiment, the openings 80-90 each have a width that is approximately equal to a width 95. The openings 80-90 can be any shape, including rectangular or round, and the widths thereof can alternatively be described as a "dimension" or "diameter," regardless of shape. In one embodiment, the width 95 has a range that is between about 0.1 micrometer (um) to about 0.5 um, for example 0.3 um.

Figure 4:
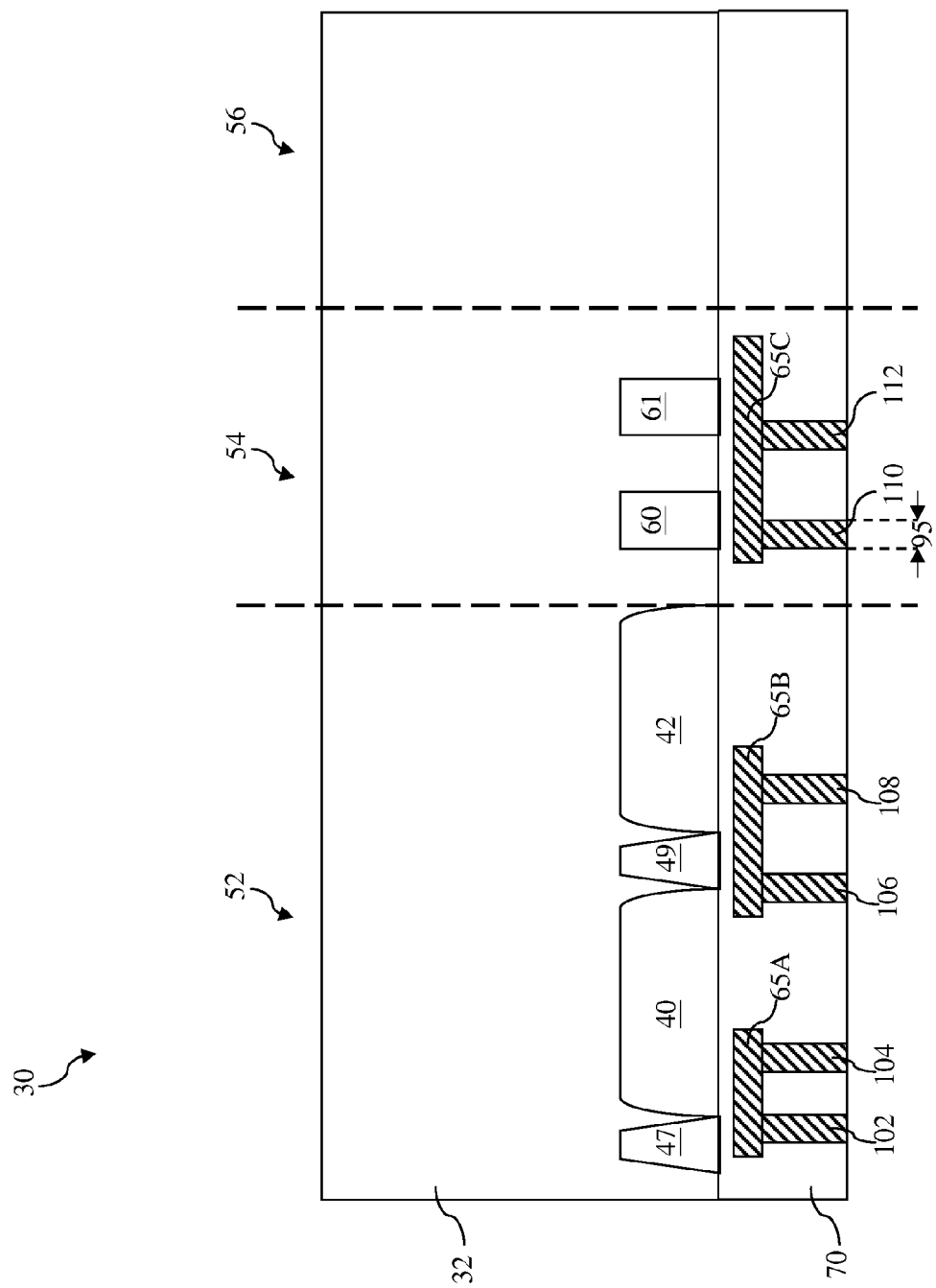

Referring now to FIG. 4, vias 102, 104, 106, and 108 are formed in the pixel region 52 by filling the openings 80, 82, 84, and 86, respectively, with a conductive material. Vias 110 and 112 are formed in the periphery region 54 by filling the openings 88 and 90, respectively, with the conductive material. Vias 102-108 and vias 110-112 may each be referred to as via arrays. The conductive material is tungsten in the present embodiment, but may be another suitable conductive material in alternative embodiments. The conductive material is formed by a deposition process known in the art, such as CVD or PVD. A chemical-mechanical-polishing (CMP) process is then performed on the vias 102-112 to ensure that the surface of the vias 102-112 are smooth and approximately co-planar with a surface of the dielectric material 70.

Referring back to FIG. 1, method 11 continues at step 19, where metal layer n is formed to connect with the vias formed at step 17.

Figure 5:
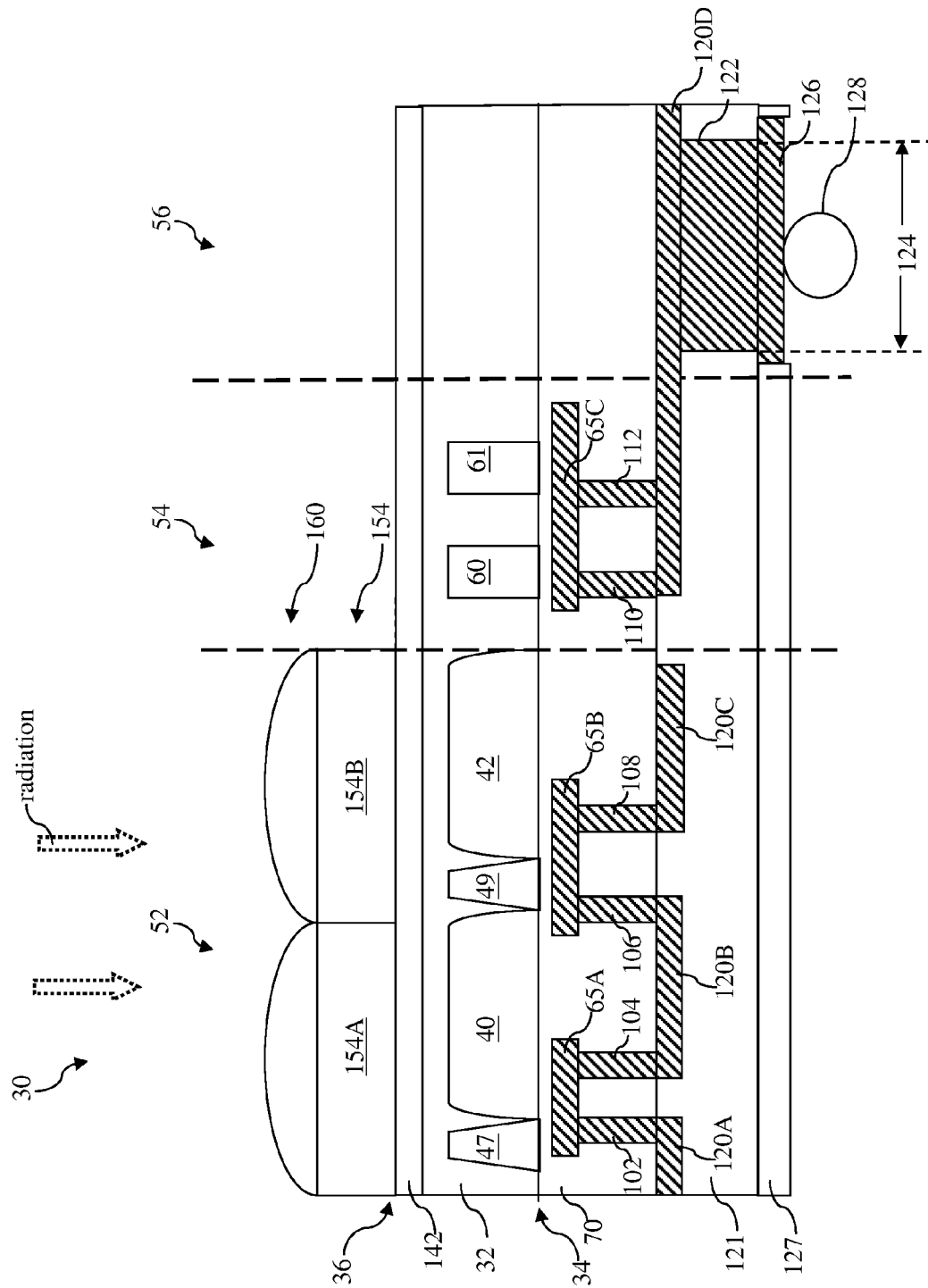

Referring now to FIG. 5 and continuing with the BSI image sensor embodiment, a conductive layer 120 is formed over the dielectric layer 70 and over the vias 102-112. With reference to the method 11 of FIG. 1, the conductive layer 120 represents layer n. The conductive layer 120 in the present embodiment is made from aluminum-copper (AlCu), and has a thickness 121 that is relatively thin. The conductive layer 120 is then patterned to form a plurality of conductive lines, for example, conductive lines 120A-120D. Electrical connections between the conductive layer 65 and the conductive layer 120 are established by the vias 102-112. Further, electrical interconnections between various vias 102-112 may also be provided by the various conductive lines in each of the conductive layers 65 and 120. A dielectric layer 121 is then formed over the conductive lines 120A-120C. The dielectric layer 121 includes materials similar to the materials of the dielectric layer 70.

Thereafter, a "big via" 122 is formed over the conductive line 120D in the bonding pad region 56. The processes that form the big via 122 are substantially similar to the processes that form the vias 102-112 and therefore will not be described again. The big via 122 has a width 124 that is substantially greater than the width 95 of the vias 102-122. The width 122 has a range that is between about 30 um to about 200 um and may be varied depending on design and manufacturing requirements. There after, a conductive line 126 is formed over the big via 122. The conductive line 126 may also be referred to as a bonding pad. A dielectric layer 127 is formed adjacent to the conductive line 126. The dielectric layer 127 includes materials similar to the materials of the dielectric layer 70. A bump 128 is then formed on the bonding pad 126. The bump 128 includes gold. Alternatively, the bump 128 may include lead.

It is understood that additional conductive layers and vias may be formed over the front side of the BSI image sensor device 30 before the big via 122 is formed, but for the sake of simplicity, these conductive layers and vias are not illustrated. The substrate may also be bonded to a carrier substrate so that a thinning process may also be performed to reduce the thickness of the substrate. Further, it is understood that the illustrations of the various conductive lines and vias are merely exemplary, and the number of conductive lines and vias as well as actual positioning and configuration of the conductive lines and vias may vary depending on design needs.

Referring back to FIG. 1, method 11 continues at step 20, where back end processing is performed. The back end processing includes such steps as wafer probe and assembly.

A passivation layer 142 is formed over the back side 36 of the BSI image sensor device 30. The passivation layer 142 includes a nitride or oxide material, or combinations thereof. The passivation layer 142 is formed by a process that may include CVD, PVD, ALD, or combinations thereof.

A color filter layer 154 is then formed over the passivation layer 142. The color filter layer 154 is formed within the pixel region 52 of the BSI image sensor device 30. The color filter layer 154 can support different color filters (e.g., red, green, and blue), and may be positioned such that the incident light radiation is directed thereon and there through. For example, the color filter layer 154 includes a color filter 154A for filtering to give the intensity information of light radiation of a first wavelength and a color filter 154B for filtering to give the intensity information of light radiation of a second wavelength. In one example, the color filter layer 154 includes red, green and blue color filters configured properly. The color filters 154A, 154B may include a dye-based (or pigment based) polymer or resin for a specific filtering effect. A micro-lens layer 160 having a plurality of micro-lenses is then formed over the color filter layer 154 for directing and focusing light radiation towards the pixels in the substrate. The lenses in the micro-lens layer 160 may be positioned in various arrangements and have various shapes depending on a refractive index of material used for the micro-lens and distance from a sensor surface. The BSI image sensor device 30 may also undergo another laser annealing process before the forming of the color filters.

Existing methods used to fabricate the BSI image sensor 30 form small vias (such as via arrays) in the bonding pad region 56. For example, vias having approximately the same size and dimension (example, the width 95) as the vias 102-112 are formed in the bonding pad region 56 using existing methods. These relatively small vias give rise to a number of fabrication issues. For example, there may be a "wire bond non-stack on pad" issue. Essentially, it is difficult to securely attach a bonding wire or a solder bump 128 to the bonding pad 126. This may be due to the fact that the bonding pad 126 is relatively thin, such that the bonding pad 126 does not provide sufficient mechanical support for the stress that may occur during the ball bonding process, which may then lead to poor bonding between the solder bump 128 and the bonding pad 126. Another issue is bonding pad peeling, meaning that the bonding pad 126 may peel off from an array of small vias therebelow. Bonding pad peeling may occur due to insufficient contact surface area between the bonding pad 126 and the small vias therebelow (since each via has a relatively small surface area). Another issue associated with using small vias in the bonding pad region 56 is the cracking of interlayer dielectric. The interlayer dielectric refers to portions of the dielectric layer 70 that would exist between the small vias. The dielectric layer 70 is typically formed of a silicon oxide material, which is similar to glass. When stress is applied, such as during bonding, the portions of the dielectric layer 70 between the small vias in the bonding pad region 56 may succumb to the stress and begin to crack. All of these issues described above would adversely affect the performance and yield of the BSI image sensor device 30.

In the present embodiment, however, these issues are overcome by forming a single big via 122 in the bonding pad region 56. With respect to the wire bond non-stack on pad issue, since the size (or width) of the big via 122 is close enough to (and in some embodiments, approximately equal to) the bonding pad 126, the big via 122 essentially extends the thickness of the bonding pad 126, making the bonding pad 126 thicker and thus more capable of providing sufficient mechanical support to withstand the bonding stress. With respect to the bonding pad peeling issue, the big via 122 offers more surface contact area with the bonding pad 126, and therefore the bonding pad 126 is less likely to peel off from the via 122. Furthermore, since the via 122 is just one big via, there is no glass-like dielectric material within the big via 122. Hence, the interlayer dielectric cracking issue does not exist in the present embodiment.

As discussed above, there are many different types of devices that can benefit from one or more embodiments of the present invention. The disclosure above describes a BSI image sensor implementing an embodiment of the present invention. The disclosure below describes a FSI image sensor implementing an embodiment of the present invention. While image sensor devices with relatively thin upper level metal layers benefit well from the present invention, it is further understood that non-image sensor devices, including those with relatively thick upper level metal layers, can also benefit from embodiments of the present invention.

Referring now to FIGS. 1 and 6-9, in another embodiment, a FSI image sensor device 180 includes an array or grid of pixels 182, 184 separated by isolation structures 185, 186.

The pixels 182, 184 can be similar to the pixels 40, 42 of the above-described BSI image sensor, modified as necessary for front-side illumination.

Figure 6:
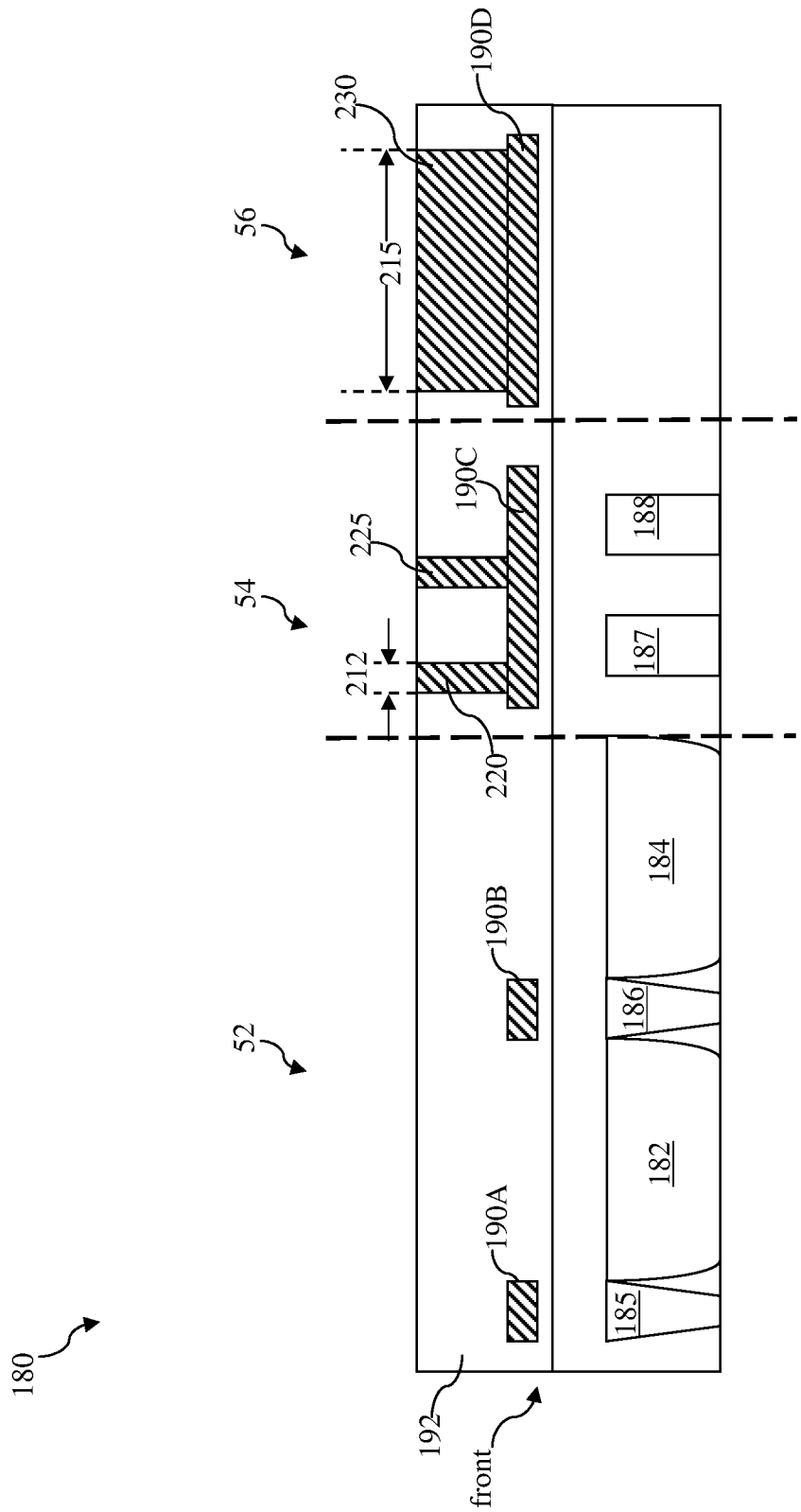
FIGS. 6-9 illustrate diagrammatic cross-sectional side views of another embodiment of the semiconductor device at various stages of fabrication according to the method of FIG. 1.

In accordance with step 15 of method 11 (FIG. 1), FIG. 6 shows a conductive layer 190 that is formed over the front side of the FSI image sensor device 180. The conductive layer 190 is conductive layer n−1. The composition and formation of the conductive layer 190 are similar to those of the conductive layer 65 described above for the BSI image sensor device 30. The conductive layer 190 is patterned to form conductive lines 190A, 190B, 190C, and 190D. Since the incident light is projected toward the front side of the FSI image sensor device 180, the conductive lines 190A and 190B in the pixel region 52 are positioned in a way such that they do not significantly obstruct the path of the incident light. It is understood that before the formation of the conductive lines 190A-190D, other conductive layers, vias, and contacts may be formed over the front side of the FSI image sensor device 180. Therefore, the conductive layer 190 may be formed over another (or a plurality of) conductive layers therebelow. For the sake of simplicity and clarity, other conductive layers, vias, and contacts that are formed before the conductive layer 190 are not illustrated. A dielectric layer (IMD) 192 is also formed around and over the conductive lines 190A-190D.

The dielectric layer 192 is patterned using a patterning process to form openings 200 and 205 in the periphery region 54, and an opening 210 in the bonding pad region 56. The patterning process includes processes that are similar to the processes included in the patterning process 75 described above in association with the BSI image device. In the present embodiment, the openings 200 and 205 each have a width that is approximately equal to a width 212, and the opening 210 has a width 215 that is substantially greater than the width 212. In one embodiment, the width 212 has a range that is between about 0.1 um to about 0.5 um, for example 0.3 um, and the width 215 has a range that is between about 30 um to about 200 um, for example about 150 um. It is understood that these ranges are merely exemplary to illustrate that the width 215 is substantially greater than the width 212. The widths 212 and 215 may have other values in alternative embodiments or if the fabrication technology generation changes.

Figure 7:
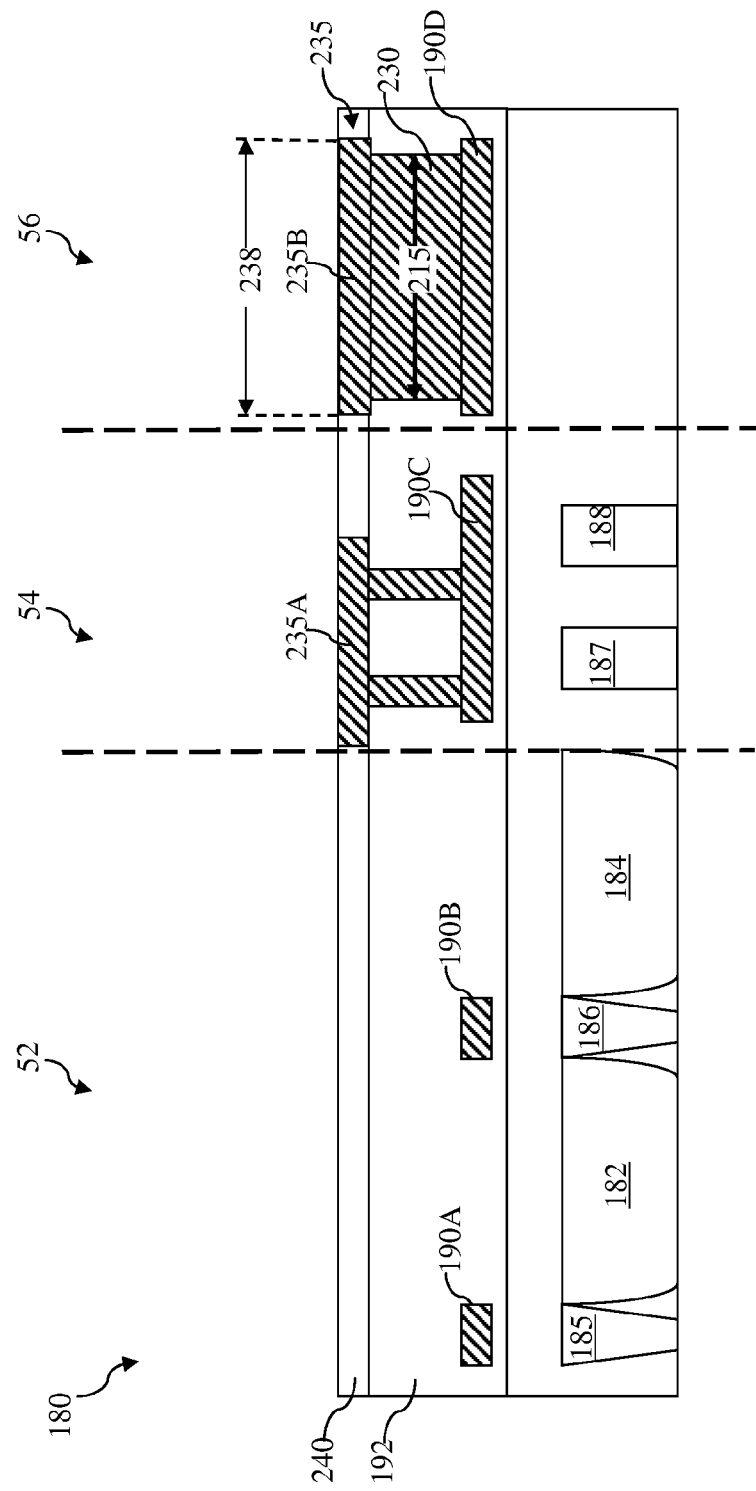

In accordance with step 17 of method 11 (FIG. 1), FIG. 7 shows vias 220, 225, and 230 that are formed by filling the openings 200, 205, and 210, respectively. The via 230 has the width 215, and the vias 220 and 225 each have widths that are approximately equal to the width 212. Thus, the via 122 is substantially greater than the vias 102-112 in size (or dimension), and is referred to as a "big via."

Figure 8:
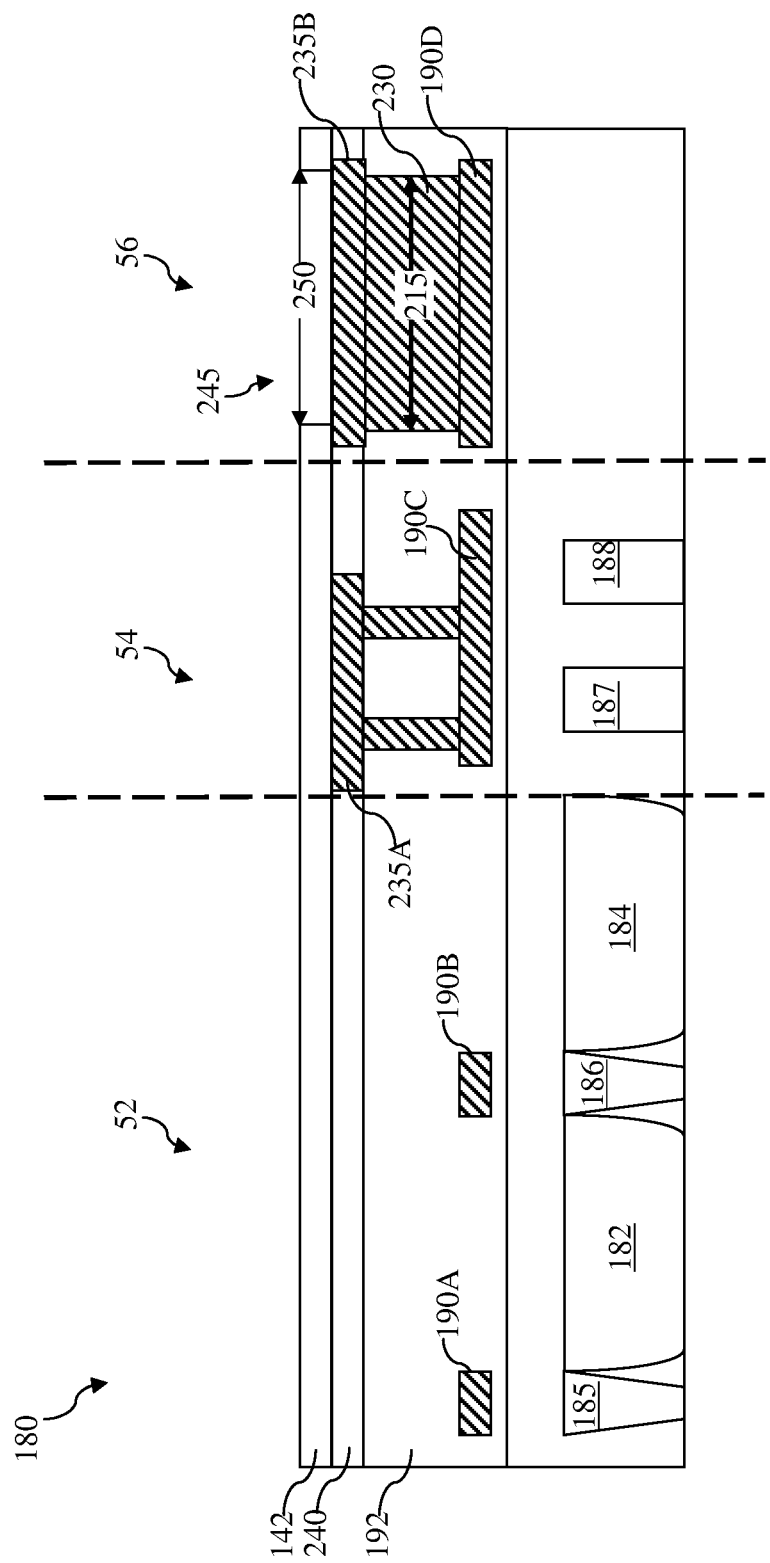

In accordance with step 19 of method 11 (FIG. 1), FIG. 8 shows a conductive layer 235 that is formed over the dielectric layer 192. The conductive layer 235 is metal layer n. The material composition and formation of the conductive layer 235 are similar to those of the conductive layer 120 described above in association with the BSI image sensor. The conductive layer 235 is patterned to form a conductive line 235A in the periphery region 54 and a conductive line 235B in the bonding pad region 56. The conductive line 235B has a width that is greater than the width 215 of the via 230. In another embodiment, the width of conductive line 235B is approximately equal to the width 215. It is understood that the various conductive lines and vias illustrated in the figure are merely exemplary, and the number of conductive lines and vias as well as actual positioning and configuration of the conductive lines vias may vary depending on design needs. A dielectric layer 240 is formed around and over the dielectric layer 192 and conductive lines 235A and 235B.

Figure 9:
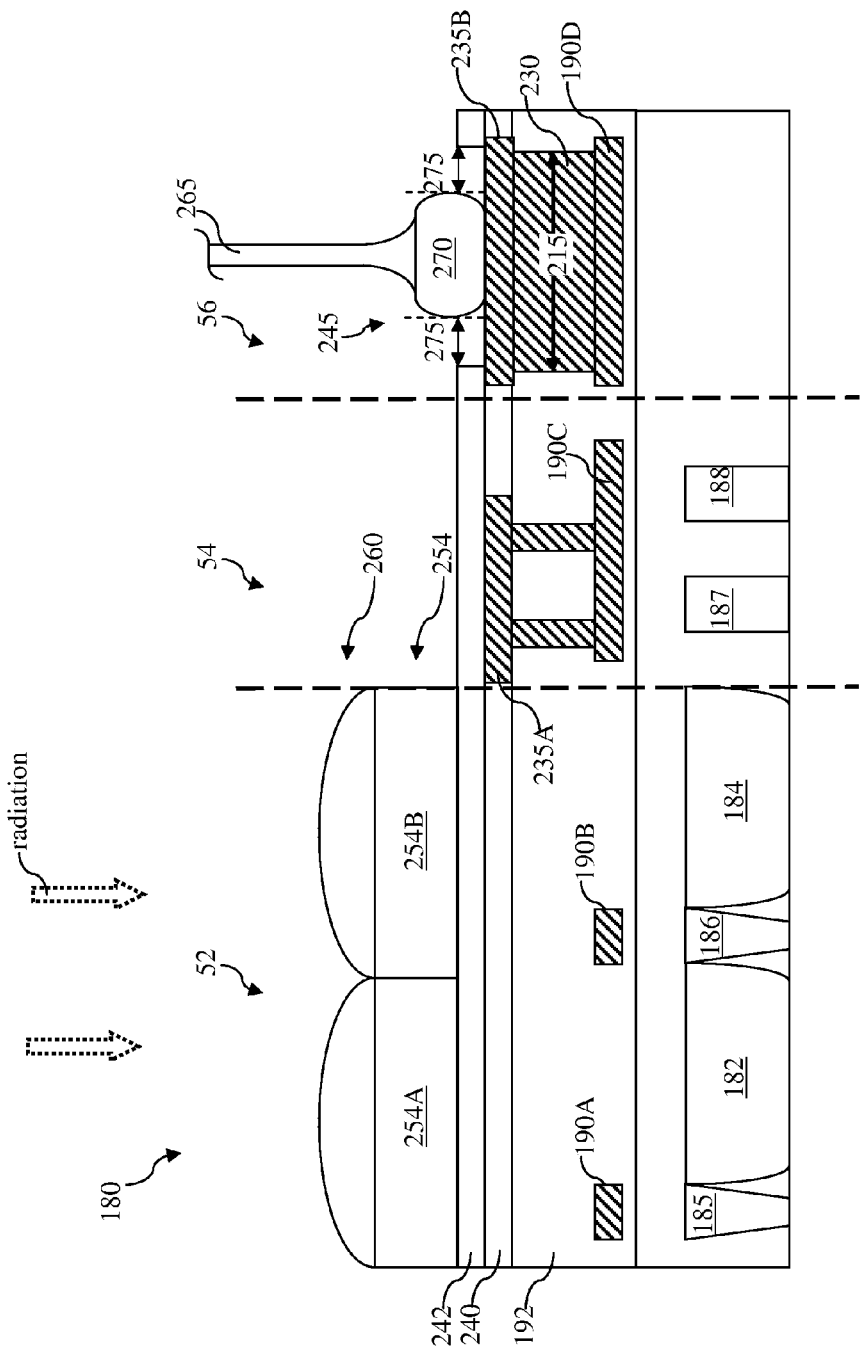

In accordance with step 21 of method 11 (FIG. 1), FIG. 9 shows a passivation layer 242 that is formed over the dielectric layer 240 and the conductive lines 235A and 235B. Thereafter, an opening 245 is formed through the passivation layer 242 in the bonding pad region 56, so that a portion of the conductive line 235B in the bonding pad region 56 is exposed from the front side. The opening 245 is formed by an etching process known in the art, such as a dry etching or wet etching process. The opening 245 has a width 250. In the present embodiment, the width 250 is less than the width of the conductive line 235B. In another embodiment, the width 250 is approximately equal to the width 238. In yet another embodiment, the width 215 of the via 230 is greater than about 2 um per side of the width 250 of the opening 245.

A color filter layer 254 is then formed over the passivation layer 242. The color filter layer 254 is formed within the pixel region 52 of the FSI image sensor device 180. The micro-lens layer 260 having a plurality of micro-lenses is then formed over the color filter layer 254 for directing and focusing light radiation towards the pixels in the substrate. The exposed portion of the conductive line 235B is bonded to the bonding wire 265 through the opening 245 using a wire bonding process known in the art. Thus, the conductive line 235B may also be referred to as a bonding pad. The wire bonding process includes a ball bonding process, in which a portion of the bonding wire 265 is melted to form the bonding ball 270. In one embodiment, the bonding wire 265 and the bonding ball 270 include gold. In other embodiments, the bonding wire 265 and the bonding ball 270 may include copper or another suitable metal. The bonding ball 270 has a size that is smaller than the width 250 of the opening 245, such that the clearance distance 275 exists on either side between edges of the bonding ball 270 and boundaries of the opening 245. In the present embodiment, the clearance distance 275 is in a range from about 2 um to about 3 um.

For reasons similar to those explained above for the BSI image sensor device 30 described in FIGS. 2-5, the FSI image sensor device 180 described in FIGS. 6-9 also does not suffer from the wire non-stack on pad, wire bonding peeling, and interlayer dielectric cracking issues associated with existing devices.

It is understood that the methods and devices described above may be used in conjunction with a "flip-chip" technology known in the art, in which solder bumps would be deposited on the bonding pad 235B. In order to mount the FSI image sensor device 180 to external circuitry (e.g., a circuit board or another chip or wafer), the image sensor device 180 is flipped over so that the side having the solder bump faces down. The bonding pad 235B is then aligned with bonding pads of the external circuitry. Thereafter, the solder bump is heated (for example, in an oven) so that the solder bump is melted and flowed, therefore creating sufficient bonding contact between the bonding pad of the image sensor and the bonding pad of the external circuitry to complete the flip chip bonding process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A front side illuminated image (FSI) sensor, comprising:
a substrate having a bonding region and a non-bonding region and having a front side and a backside;
a first conductive line on the front side of the substrate in the bonding region;
a second conductive line on the front side of the substrate in the non-bonding region;
a first via having a first diameter over the first conductive line;
a second via having a second diameter over the second conductive line, the first diameter being substantially greater than the second diameter;
a third conductive line formed over the first via, wherein the third conductive line is adapted to receiving a bonding mechanism; and
a pixel disposed in the non-bonding region adjacent the second conductive line, wherein the non-bonding region is configured to allow light directed towards the front side of the substrate to reach the pixel.

2. The FSI sensor of claim 1, further comprising a fourth conductive line formed over the second via.

3. The FSI sensor of claim 2, wherein the third and fourth conductive lines are formed in a top-most metal layer.

4. The FSI sensor of claim 3, wherein the first and second conductive lines are formed in a same metal layer below the top-most metal layer.

5. The FSI sensor of claim 1, wherein the first diameter ranges between about 30 micrometers and about 200 micrometers; and the second diameter ranges between about 0.1 micrometer and about 0.5 micrometers.

6. The FSI sensor of claim 1, wherein the first and third conductive lines comprise aluminum.

7. The FSI sensor of claim 1, further comprising a fourth conductive line on the front side of the substrate in the non-bonding region,
wherein the third and fourth conductive lines are formed in a topmost metal layer over the semiconductor substrate,
wherein the first and second conductive lines are formed in the same metal layer below the topmost metal layer over the semiconductor substrate,
wherein the first and third conductive lines physically contact the first via, and
wherein the first and second conductive lines are separated from each other by a dielectric material in the metal layer.

8. The FSI sensor of claim 7, wherein the third conductive line is a bonding pad.

9. The FSI sensor of claim 1, further comprising a fourth conductive line on the front side of the substrate in the non-bonding region,
wherein the first, second, and fourth conductive lines are formed in the same metal layer over the semiconductor substrate,
wherein the first and third conductive lines physically contact the first via, and
wherein the second and fourth conductive lines are separated from each other by a dielectric material in the metal layer thereby forming a light pathway through the metal layer, and
wherein the pixel is aligned with the light pathway such that light directed towards the front side of the substrate reaches the pixel through the light pathway.

10. A device comprising:
a substrate having a bonding pad region and a non-bonding pad region;
a first via formed over the substrate in the bonding pad region, wherein the first via is disposed between, and physically contacting, a first conductive component and a second conductive component, the first via having a first dimension in a top view toward the substrate; and
a plurality of second vias formed over the substrate in the non-bonding pad region, wherein at least a subset of the second vias are disposed between, and physically contacting, a third conductive component and a fourth conductive component, the plurality of second vias each having a second dimension in the top view and the second dimension being different than the first dimension,
wherein the first conductive component and the third conductive component are disposed in a first metal layer, and wherein the second conductive component and the fourth conductive component are disposed in a second metal layer that is different from the first metal layer,
wherein the second conductive component is a topmost layer of the bonding pad, and
wherein the first conductive component and the third conductive component are separated from each other by a dielectric material that extends from an edge of the first conductive component to an edge of the second conductive component.

11. The device of claim 10, wherein the first dimension is substantially greater than the second dimension.

12. The device of claim 10, wherein the substrate includes a front side and an opposing back side, and
wherein the non-bonding pad region includes an image sensor configured to detect light directed toward the front side of the substrate.

13. The device of claim 10, wherein the non-bonding pad region includes a periphery region and a pixel region, and
wherein the second metal layer extends into the periphery region and the pixel region.

14. The device of claim 10, further comprising a color filter and a microlens formed over a side of the substrate, wherein the first via and the plurality of second vias are formed over the side of the substrate.

15. The device of claim 10, wherein the first conductive component includes aluminum copper (AlCu).

16. The device of claim 10, wherein the substrate includes a front side and an opposing back side, and
wherein the non-bonding pad region includes an image sensor adjacent the second via, wherein the non-bonding pad region is configured to allow light directed towards the front side of the substrate to reach the image sensor.

17. A device comprising:
a semiconductor substrate having a bonding pad region and a non-bonding pad region, wherein the semiconductor substrate has a front side and an opposing back side;
a first via disposed over the front side of the semiconductor substrate in the bonding pad region such that the entire first via is disposed over the semiconductor substrate without extending through the semiconductor substrate, the first via having a first dimension in a top view toward the substrate;
a second via formed over the front side of the semiconductor substrate in the non-bonding pad region, the second via having a second dimension in the top view toward the substrate that is different than the first dimension; and
an image sensor disposed in the non-bonding pad region adjacent the second via, wherein the non-bonding pad region is configured to allow light directed towards the front side of the substrate to reach the image sensor.

18. The device of claim 17, wherein the second dimension is substantially less than the first dimension.

19. The device of claim 17, wherein the first and second vias extend between a first metal line and a second metal line, the first and second metal lines being formed of different materials.

20. The device of claim 17, wherein the first via physically contacts a first and second conductive component and the second via physically contacts a third and fourth conductive component,
   wherein the first and third conductive components are disposed in a first metal layer, wherein the first conductive component is a bonding pad,
   wherein the second and fourth conductive components are disposed in a second metal layer that is under the first metal layer, wherein the second and fourth components in the second metal layer are separated from each other by a dielectric material.

\* \* \* \* \*